(12) United States Patent
Zhou et al.

(10) Patent No.: US 10,971,525 B1
(45) Date of Patent: Apr. 6, 2021

(54) TFT ARRAY SUBSTRATE AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Zhichao Zhou, Guangdong (CN); Hui Xia, Guangdong (CN); Meng Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 433 days.

(21) Appl. No.: 16/091,948

(22) PCT Filed: Jun. 8, 2018

(86) PCT No.: PCT/CN2018/090376
§ 371 (c)(1),
(2) Date: Oct. 5, 2018

(87) PCT Pub. No.: WO2019/205235
PCT Pub. Date: Oct. 31, 2019

(30) Foreign Application Priority Data

Apr. 27, 2018 (CN) .......................... 201810395559.7

(51) Int. Cl.
*H01L 21/00* (2006.01)
*H01L 27/12* (2006.01)

(52) U.S. Cl.
CPC ........ *H01L 27/1222* (2013.01); *H01L 27/127* (2013.01); *H01L 27/1225* (2013.01)

(58) Field of Classification Search
CPC ...................... H01L 27/1222; H01L 27/1225; H01L 27/127
See application file for complete search history.

(56) References Cited

U.S. PATENT DOCUMENTS 10,658,392 B1 * 5/2020 Chen ................. H01L 29/41733
2010/0006894 A1 1/2010 Ohta et al.
(Continued)

FOREIGN PATENT DOCUMENTS

CN          1870296 A     11/2006
CN        104332490 A      2/2015
(Continued)

*Primary Examiner* — Richard A Booth
(74) *Attorney, Agent, or Firm* — Leong C. Lei

(57) ABSTRACT

The present invention teaches a TFT array substrate and its manufacturing method including the following steps. A data line and a ring-shaped source electrode are formed on a substrate. A first insulation layer is formed on the substrate. A ring trough exposing the source electrode is formed on the first insulation layer. A semiconductor active layer is formed in the ring trough. A channel is formed on the first insulation layer in an area surrounded by the ring trough. A gate line, a gate electrode in the channel, and a drain electrode connected to the semiconductor active layer are formed on the first insulation layer. A second insulation layer is formed on the first insulation layer, and a pixel via is formed on the second insulation layer. A pixel electrode is formed on the second insulation layer, and is connected to the drain electrode through the pixel via.

19 Claims, 10 Drawing Sheets

(56) References Cited

U.S. PATENT DOCUMENTS

2016/0300899 A1* 10/2016 Zhang ............... H01L 29/42384
2018/0342591 A1* 11/2018 Wen ................. H01L 29/78669

FOREIGN PATENT DOCUMENTS

CN          204155937 U      2/2015
CN          106953011 A      7/2017

* cited by examiner

TFT ARRAY SUBSTRATE AND MANUFACTURING METHOD THEREOF

RELATED APPLICATIONS

The present application is a National Phase of International Application Number PCT/CN2018/090376, filed Jun. 8, 2018, and claims the priority of China Application No. 201810395559.7 filed Apr. 27, 2018.

FIELD OF THE INVENTION

The present invention is generally related to the field of display technology, and more particularly to a thin film transistor (TFT) array substrate and its manufacturing method.

BACKGROUND OF THE INVENTION

Flat panel display devices are widely popular due to their thin thickness, power saving, and low radiation. Existing flat panel display devices mainly include liquid crystal display (LCD) and organic light emitting diode (OLED) display devices. Thin film transistor (TFT) array substrate is a key component to flat panel display device. A TFT array substrate may be formed on a glass substrate or a plastic substrate.

TFT array substrate includes TFTs arranged in an array on a substrate. Conventionally, as shown in FIG. 1, a TFT includes a gate electrode 2 on a glass substrate 1, a gate insulation layer 3 on and covering the gate electrode 2, an active layer 4 on the gate insulation layer 3, and a source electrode 5 and a drain electrode 6 on the active layer 5. The source electrode 5 and the drain electrode 6 are laterally separated with a gap in between. A part of the active layer 4 beneath the gap is a ditch region 4a. As shown in FIG. 1, the ditch region 4a of the active layer 4 may easily be affected by subsequent processes, especially when the active layer 4 is made of oxide semiconductor. For example, after the active layer 4 is formed and when a mask process for the source electrode 5 and the drain electrode 6 is under way, the surface of the ditch region 4a of the active layer 4 may be damaged by the etching solution, causing the electrical properties of the TFT (e.g., reliability and stability of threshold voltage) to deteriorate.

SUMMARY OF THE INVENTION

Therefore, the present invention provides a TFT array substrate and its manufacturing method where the ditch region of the TFT is effectively protected, and the stability of the electrical properties of the TFT is enhanced.

To achieve the objective, the present invention adopts the following technical solution.

A TFT array substrate manufacturing method includes the following steps:

S10: providing a substrate and forming a TFT on the substrate, comprising

S101: forming pattered data line and source electrode on the substrate, where the data line and the source electrode are connected to each other, and the source electrode has a ring shaped structure, S102: forming a first insulation layer on the substrate to cover the data line and the source electrode, S103: forming a ring trough on the first insulation layer by etching, where the source electrode is exposed from the ring trough, S104: forming in the ring trough a semiconductor active layer that connects the source electrode, S105: forming a channel on the first insulation layer by etching in an area surrounded by the ring trough, and S106: forming patterned gate line, gate electrode, and drain electrode on the first insulation layer, where the gate electrode is formed in the channel opposite to the semiconductor active layer and is connected to the gate line, and the drain electrode is connected to the semiconductor active layer;

S20: forming a second insulation layer on the TFT, and forming a pixel via on the second insulation layer to expose the drain electrode; and S30: forming patterned pixel electrode on the second insulation layer, where the pixel electrode is connected to the drain electrode through the pixel via.

In step S105, the first insulation layer is further configured with a gate trough surrounding a periphery of the ring trough. In step S106, patterned secondary gate electrode is formed on the first insulation layer in the gate trough oppositely to the semiconductor active layer. In step S20, a gate via is further configured in the second insulation layer. In step S30, patterned secondary gate line is formed on the second insulation layer and is connected to the secondary gate electrode through the gate via.

In step S10, identically structured first, second, and third TFTs are formed at intervals on the substrate following steps S101 to S106. The first TFT has its source electrode connected to the data line, and the second and third TFTs have their source electrodes connected to each other. In step S20, a first pixel via, a second pixel via, and a third pixel via are formed by etching on the second insulation layer corresponding to where the drain electrodes of the first, second, and third TFTs are located. In step S30, patterned primary pixel electrode, secondary pixel electrode, and 20c through the third pixel are formed on the second insulation layer. The primary pixel electrode is connected to the drain electrode of the first TFT through the first pixel via, the secondary pixel electrode is connected to the drain electrode of the third TFT through the third pixel via, and the connection line connects the drain electrodes of the first and second TFTs together through the first and second pixel vias.

The present invention also teaches a TFT array substrate, including a pixel unit boxed out by the data lines and gate lines, wherein the pixel unit includes a TFT and a pixel electrode configured in the pixel unit; the TFT includes:

a source electrode formed on the substrate where the source electrode has a ring shape, is at a same layer as a corresponding data line, and is connected to the data line, a first insulation layer formed on the substrate that covers the source electrode and the data line where a ring trough and a channel are configured in the first insulation layer, the ring trough is above and exposes the source electrode, and the channel is located in an area surrounded by the ring trough, a semiconductor active layer formed in the ring trough connected to the source electrode, a gate electrode formed in the channel opposite to the semiconductor active layer, a drain electrode formed on the first insulation layer connected to the semiconductor active layer where a corresponding gate line is formed on the first insulation layer connected to the gate electrode, and a second insulation layer covering the TFT where a pixel via is configured in the second insulation layer, and the pixel electrode is formed on the second insulation layer connected to the drain electrode through the pixel via.

The source electrode has a ring structure with a gap. The semiconductor active layer and the drain electrode has a same shape as the source electrode. The source electrode, the semiconductor active layer, and the drain electrode are sequentially stacked and connected.

The channel has a cylindrical shape. The gate electrode has a cylindrical shape. The semiconductor active layer and the gate electrode are disposed co-axially.

The pixel unit includes identically structured first, second, and third TFTs at intervals, and a primary pixel electrode and a secondary pixel electrode. The first TFT has its source electrode connected to the data line, and the second and third TFTs have their source electrodes connected to each other. The gate electrodes of the first, second, and third TFTs are respectively connected to the gate line. The primary pixel electrode is connected to the drain electrode of the first TFT. The secondary pixel electrode is connected to the drain electrode of the third TFT. The drain electrodes of the first and second TFTs are connected together.

The TFT further includes a secondary gate electrode. The array substrate further includes a secondary gate line. The first insulation layer is further configured with a gate trough surrounding the periphery of the ring trough. The secondary gate electrode is formed in the gate trough oppositely to the semiconductor active layer; a gate via is further configured in the second insulation layer. The secondary gate line is formed on the second insulation layer and is connected to the secondary gate electrode through the gate via.

The gate trough has an identical shape as the ring trough, and surrounds a periphery of the ring trough.

The pixel unit includes identically structured first, second, and third TFTs at intervals, and a primary pixel electrode and a secondary pixel electrode. The first TFT has its source electrode connected to the data line, and the second and third TFTs have their source electrodes connected to each other. The gate electrodes of the first, second, and third TFTs are respectively connected to the gate line. The secondary gate electrodes of the first, second, and third TFTs are respectively connected to the secondary gate line. The primary pixel electrode is connected to the drain electrode of the first TFT. The secondary pixel electrode is connected to the drain electrode of the third TFT. The drain electrodes of the first and second TFTs are connected together.

In one embodiment of the present invention, the TFT array substrate and its manufacturing method has the semiconductor active layer embedded in the insulation layer. The semiconductor active layer surrounds the gate electrode and forms a ring-shaped, vertically structured ditch region whose top side is covered by the insulation layer. Therefore, the adversary influence to the ditch region by the subsequent processes after the semiconductor active layer is formed can be effectively prevented, enhancing the electrical stability of the TFT.

In another embodiment, the TFT on the array substrate is further configured with the secondary gate electrode. Through the secondary gate electrode, the threshold voltage drift problem when the TFT is operated for an extended period of time is resolved.

In yet another embodiment, the pixel unit on the array substrate includes three TFTs sequentially connected in series. The primary pixel electrode is connected to the first TFT, and the secondary pixel electrode is connected to the third TFT, thereby forming a multi-domain structure. Through series-connecting three TFTs with ring-shaped, vertically structured ditch regions, different pixel voltages are applied to the primary and secondary pixel electrodes, improving the wide viewing angle and color shift problems.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

It should be noted that the appended figures only include structures and processing steps closely related to the technical solution of the present invention. Unnecessary details are omitted so as not to obscure the present invention.

Embodiment 1

Figure 1:
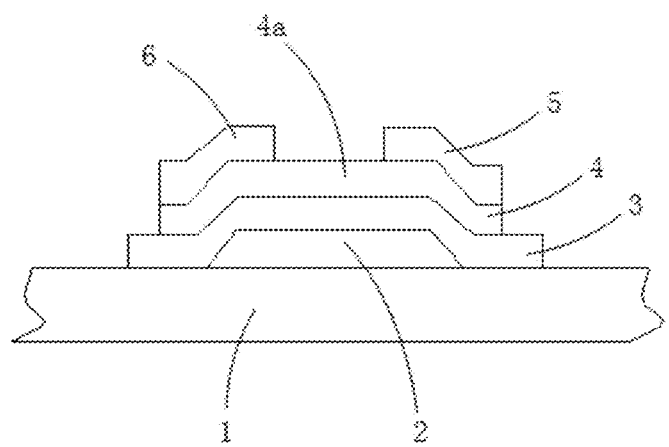
FIG. 1 is a structural schematic diagram showing a sectional structure of a conventional TFT.
Figure 2:
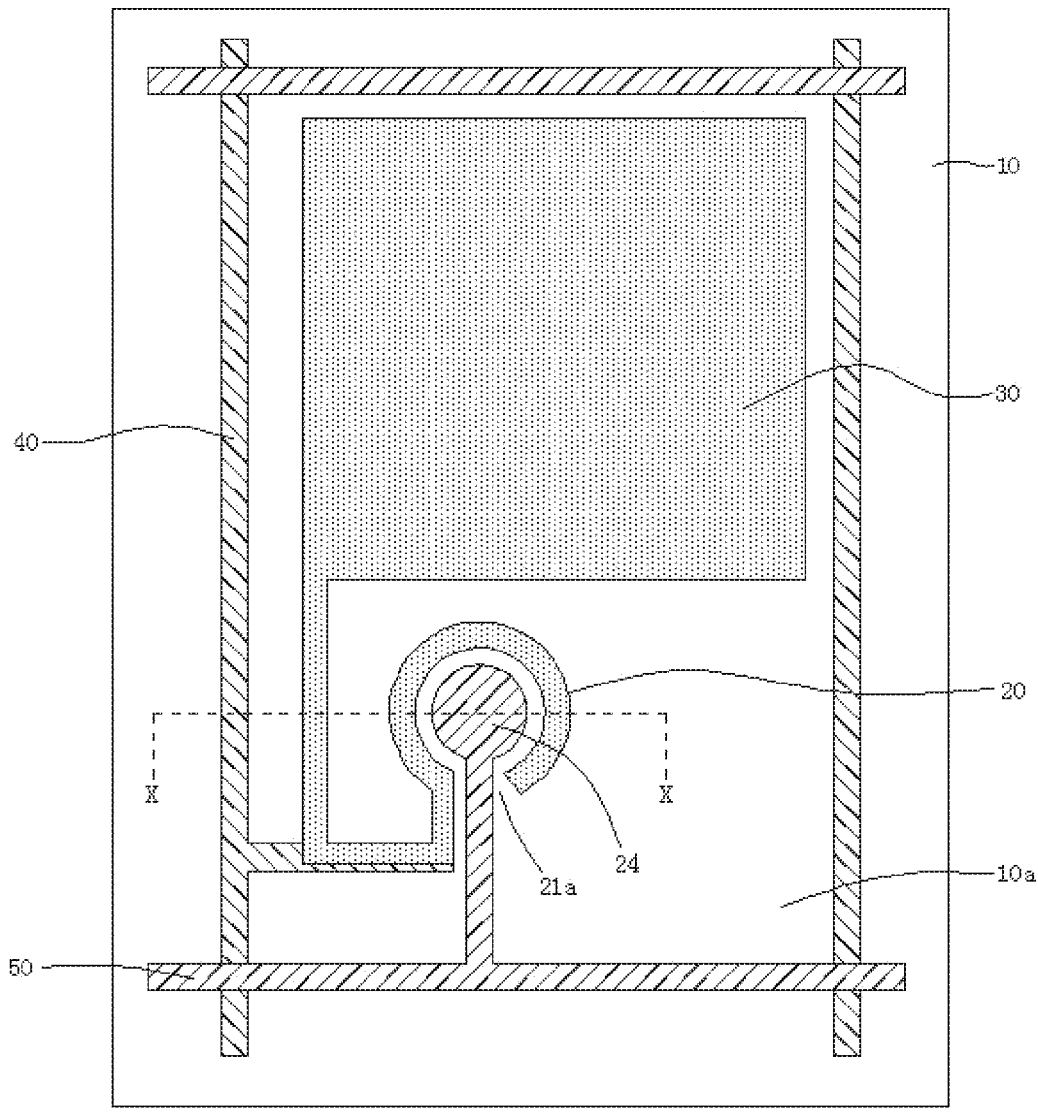
FIG. 2 is a planar diagram showing a TFT array substrate according to a first embodiment of the present invention.
Figure 3:
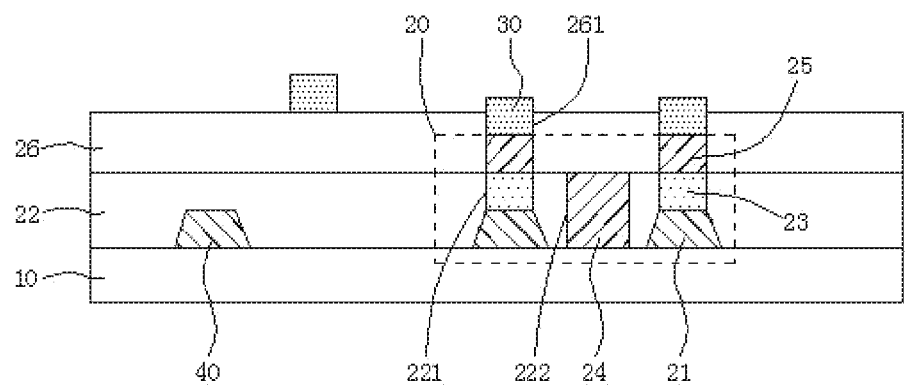
FIG. 3 is a sectional diagram showing an X-X section of the TFT array substrate of FIG. 2.

As shown in FIGS. 2 and 3, FIG. 2 is a planar diagram showing a thin film transistor (TFT) array substrate according to a first embodiment of the present invention and FIG. 3 is a sectional diagram showing an X-X section of the TFT array substrate of FIG. 2. The insulation layer of the TFT array substrate is omitted from FIG. 2. As illustrated, the TFT array substrate includes a pixel unit 10a boxed out by the data lines 40 and gate lines 50. A TFT 20 and a pixel electrode 30 are configured in the pixel unit 10a. The TFT 20 and the pixel unit 30 are electrically connected.

The TFT 20 includes, on a substrate 10, a source electrode 21, a first insulation layer 22, a semiconductor active layer 23, a gate electrode 24, and a drain electrode 25. Specifically, the source electrode 21 is formed on the substrate 10, and has a ring shape. A corresponding data line 40 is at a same layer as and is connected to the source electrode 21. The first insulation layer 22 is formed on the substrate 10 and covers the source electrode 21 and the data line 40. A ring trough 221 and a channel 222 are configured in the first insulation layer 22. The ring trough 221 is above and exposes the source electrode 21. The channel 222 is located in an area surrounded by the ring trough 221. The semiconductor active layer 23 is formed in the ring trough 221 and connected to the source electrode 21. The gate electrode 24 is formed in the channel 222 opposite to the semiconductor active layer 23. The drain electrode 25 is formed on the first insulation layer 22 and connected to the semiconductor active layer 23. A corresponding gate line 50 is formed on the first insulation layer 22 and connected to the gate electrode 24.

The TFT 20 is covered by a second insulation layer 26. A pixel via 261 is configured in the second insulation layer 26. The pixel electrode 30 is formed on the second insulation layer 26 and connected to the drain electrode 25 through the pixel via 261.

As described above, the semiconductor active layer 23 is formed in the ring trough 221. In other words, the semiconductor active layer 23 is embedded in the first insulation layer 22. The semiconductor active layer 23 therefore surrounds the gate electrode 24 and forms a ring-shaped, vertically structured ditch region whose top side is covered by the first insulation layer 22. Therefore, the adversary influence to the ditch region by the subsequent processes after the semiconductor active layer 23 is formed can be effectively prevented, enhancing the electrical stability of the TFT.

In the present embodiment, as shown in FIGS. 2 and 3, the source electrode 21 has a ring structure with a gap 21a. The semiconductor active layer 23 and the drain electrode 25 has a same shape as the source electrode 21. The source electrode 21, the semiconductor active layer 23, and the drain electrode 25 are sequentially stacked and connected. The semiconductor active layer 23 has a ring structure surrounding the gate electrode 24, thereby forming the ring-shaped, vertically structured ditch region. The gate line 50 extends right above the gap 21a and connects the gate electrode 24.

Furthermore, in the present embodiment as shown in FIG. 3, the channel 222 has a cylindrical shape penetrating the top and bottom sides of the first insulation layer 22. The gate electrode 24 also has a cylindrical shape. The semiconductor active layer 23 and the gate electrode 24 are disposed co-axially.

The semiconductor active layer 23 is made of an oxide semiconductor material such as GaInZnO, ZnO, InZnO, ZnSnO, or ZrInZnO, preferably GaInZnO. It should be noted that in alternative embodiments, the material of the semiconductor active layer 23 may also be other material common to the related art, such as amorphous silicon or poly-silicon.

The data line 40, the gate line 50, the source electrode 21, the drain electrode 25, and the gate electrode 24 may be made of Mo, Ti, or their combination. The first and second insulation layers 22 and 26 may be made of SiOx, SiNx, or their combination. The pixel electrode 30 is made of ITO.

The present invention also teaches a manufacturing method for the TFT array substrate described above. As shown in FIGS. 4a to 4i, a manufacturing method for the TFT array substrate of FIGS. 2 and 3 includes the following steps.

S10 providing a substrate 10 and forming a TFT 20 on the substrate. This step includes the following steps.

Figure 4A:
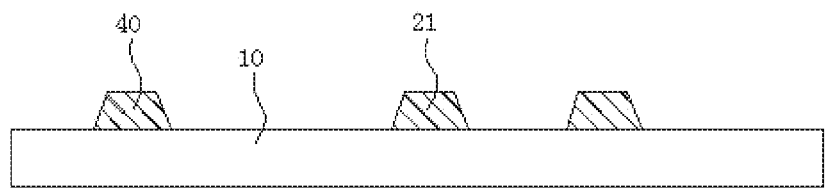
FIGS. 4a-4k show the TFT array substrate after the steps of a manufacturing method according to a first embodiment of the present invention.
Figure 4B:
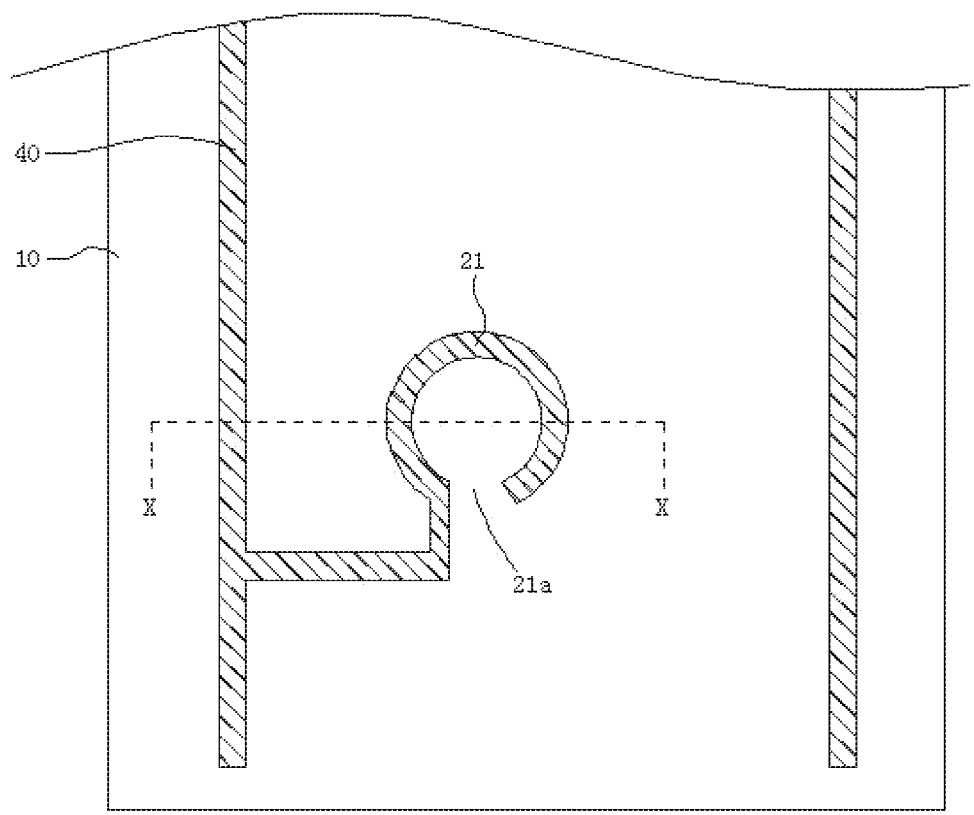

S101: as shown in FIGS. 4a and 4b, forming patterned data line 40 and source electrode 21 on the substrate 10 through a first mask process (patterning process). The data line 40 and the source electrode 21 are connected to each other. The source electrode 21 has a ring shaped structure. FIG. 4b is a planar view to FIG. 4a. FIG. 4a is a sectional diagram showing the X-X section of FIG. 4b.

Figure 4C:
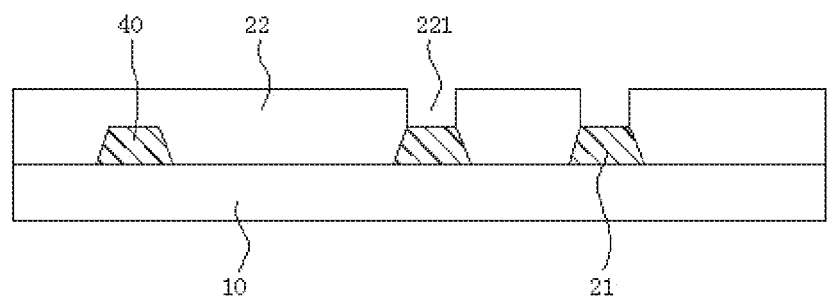

S102: as shown in FIG. 4c, forming a first insulation layer 22 on the substrate 10 to cover the data line 40 and the source electrode 21.

S103: as shown in FIG. 4c, forming a ring trough 221 on the first insulation layer 22 by etching through a second mask process. The ring trough 221 has a shape corresponding to that of the source electrode 21. The source electrode 21 is exposed from the ring trough 221.

Figure 4D:
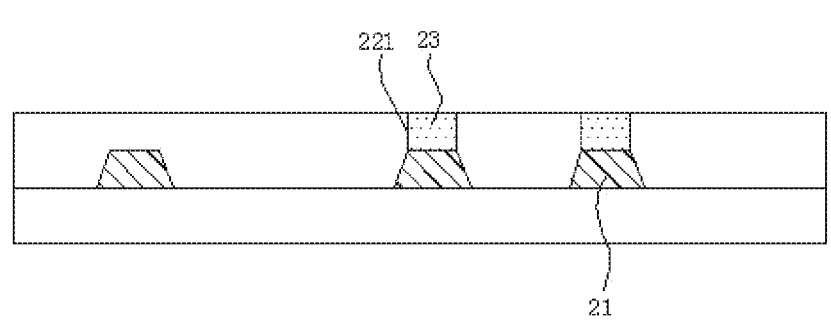
Figure 4E:
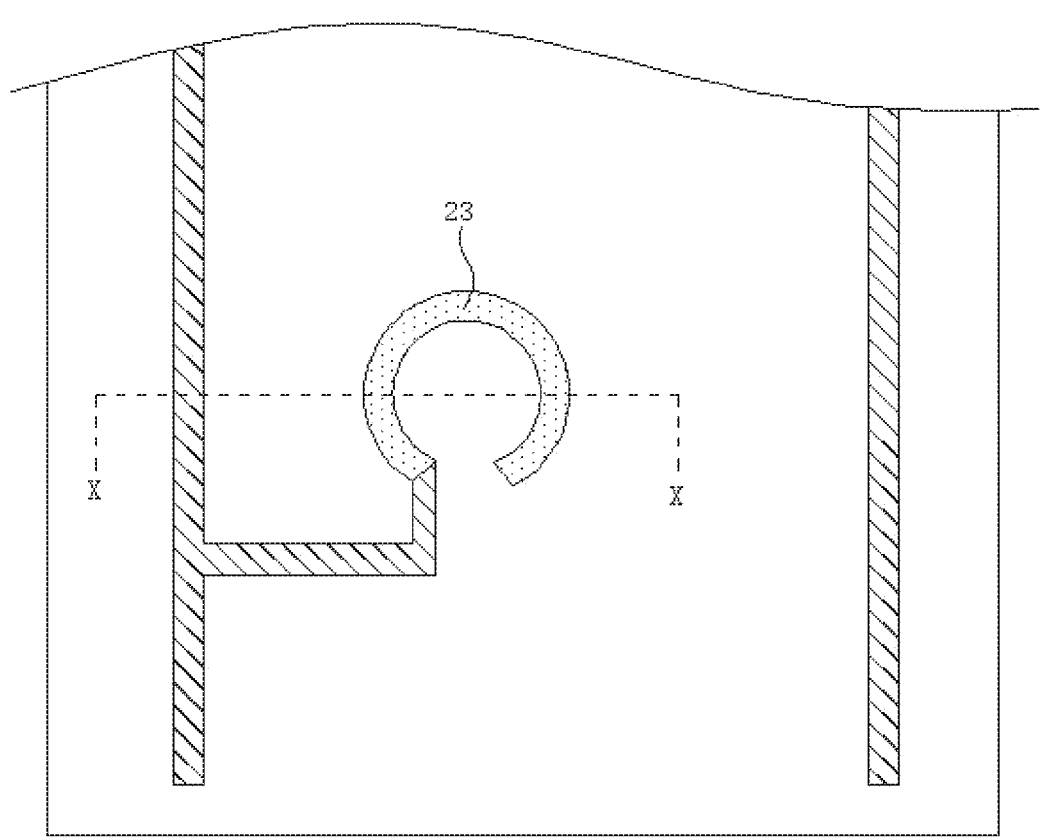

S104: as shown in FIGS. 4d and 4e, forming in the ring trough 221 a semiconductor active layer 23 that connects the source electrode 21. FIG. 4e is a planar view to FIG. 4d. FIG. 4d is a sectional diagram showing the X-X section of FIG. 4e.

Specifically, a semiconductor material is deposited in the ring trough 221 so as to form the semiconductor active layer 23. To achieve this, a photoresist mask exposing only the ring trough 221 is applied to the first insulation layer 22. Alternatively, the photoresist mask used by the second mask process in step S103 in forming the ring trough 221 is used again to deposit the semiconductor material. Then, the photoresist mask is lifted, and the semiconductor active layer 23 is obtained in the ring trough 221.

Figure 4F:
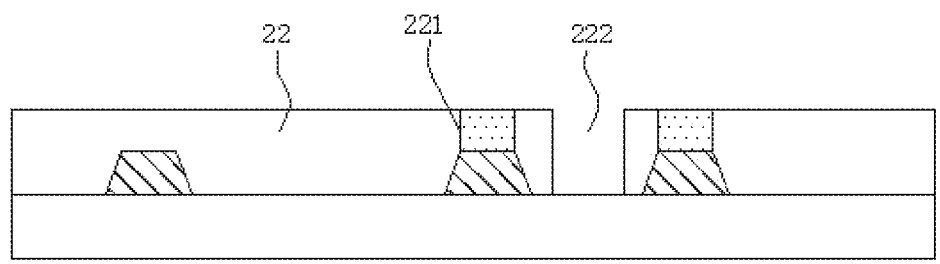

S105: as shown in FIG. 4f, forming a channel 222 on the first insulation layer 22 by etching in an area surrounded by the ring trough 221 through a third mask process. In the present embodiment, the channel 222 is a via penetrating the first insulation layer 22 from a top side to an opposite bottom side of the first insulation layer 22.

Figure 4G:
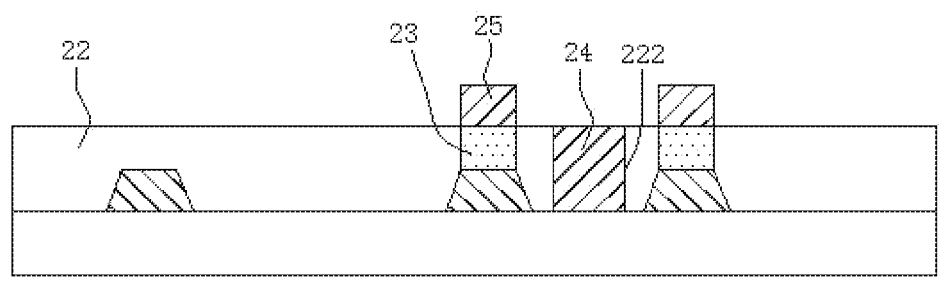
Figure 4H:
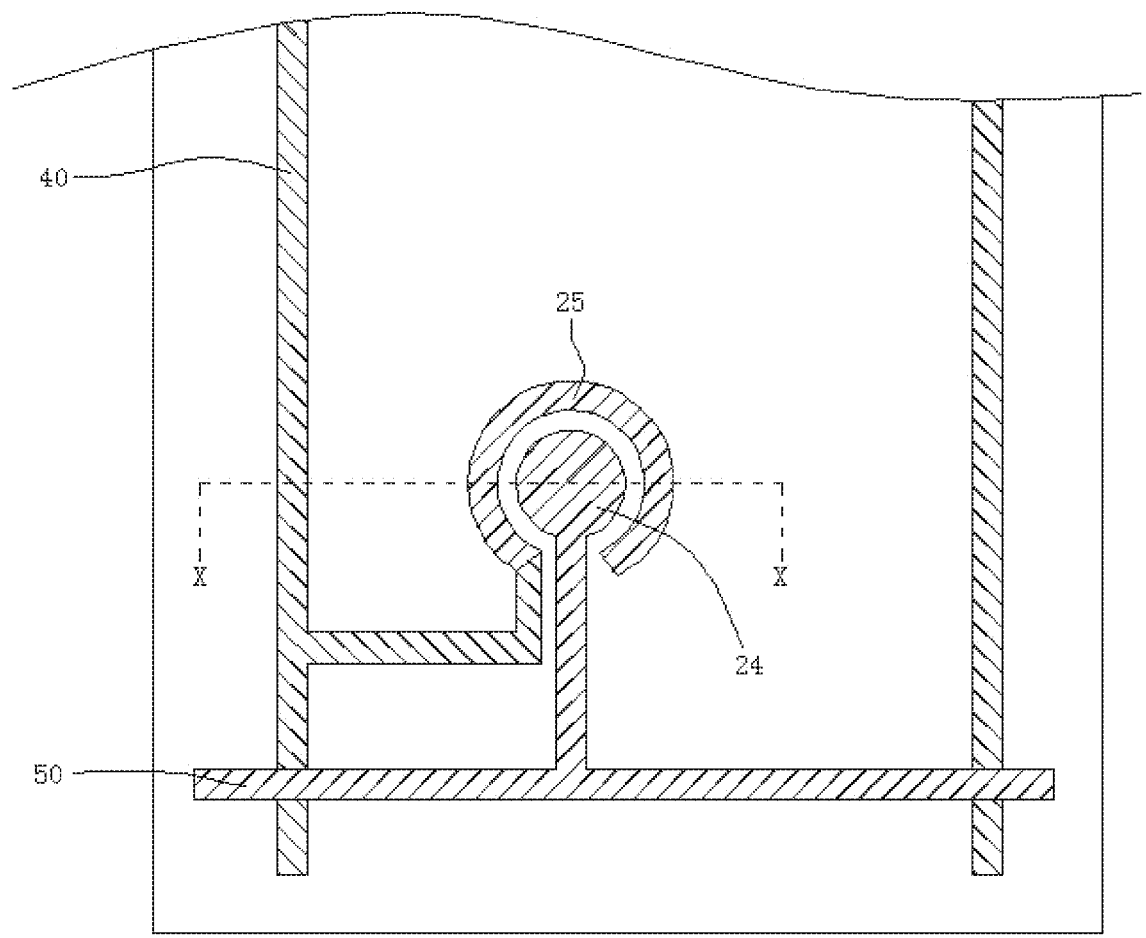

S106: as shown in FIGS. 4g and 4h, forming patterned gate line 50, gate electrode 24, and drain electrode 25 on the first insulation layer 22. The gate electrode 24 is formed in the channel 222 opposite to the semiconductor active layer 23 and is connected to the gate line 50. The drain electrode 25 is connected to the semiconductor active layer 23. FIG. 4h is a planar view to FIG. 4g. FIG. 4g is a sectional diagram showing the X-X section of FIG. 4h.

Specifically, steps S105 and S106 are usually conducted in a same mask process. In the third mask process, a photoresist mask with a full exposure region (corresponding to where the channel 222 is to be formed), a first thickness region (corresponding to where the gate electrode 24 and the drain electrode 25 are to be formed), and a second thickness region is formed on the first insulation layer 22 using half-gray exposure and development. The first thickness region has a thickness smaller than that of the second thickness region.

Firstly, the channel 222 is formed by etching the first insulation layer 22 in the full exposure region of the photoresist mask. Then, an ashing process is conducted to the photoresist mask so that the photoresist in the first thickness region is completely removed and the thickness of the second thickness region is reduced. Finally, electrode material is deposited on the photoresist mask, the photoresist mask is lifted, and the TFT 20 is obtained on the substrate 10 after forming the gate line 50, the gate electrode 24, and the drain electrode 25.

Figure 4I:
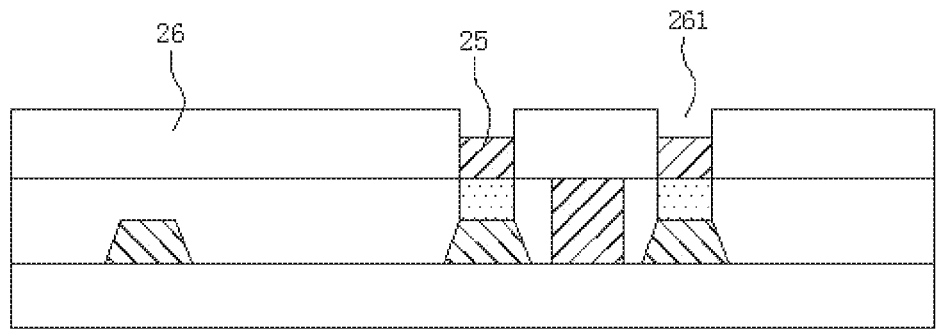

S20: as shown in FIG. 4i, forming a second insulation layer 26 on the first insulation layer 22 covering the TFT 20, and forming a pixel via 261 on the second insulation layer 26 using a fourth mask process to expose the drain electrode 25.

Figure 4J:
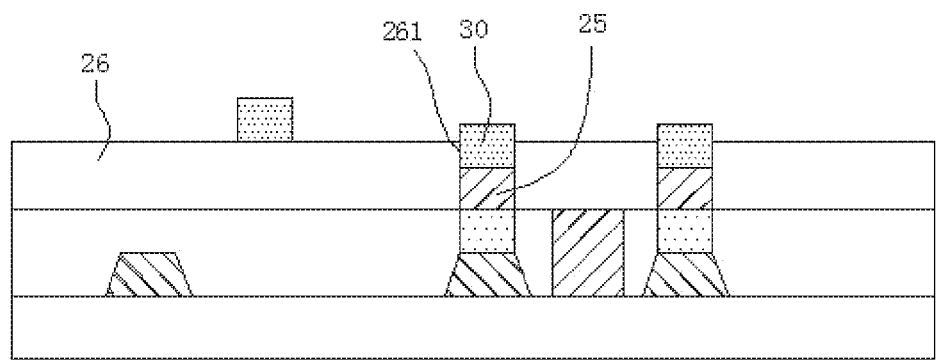
Figure 4K:
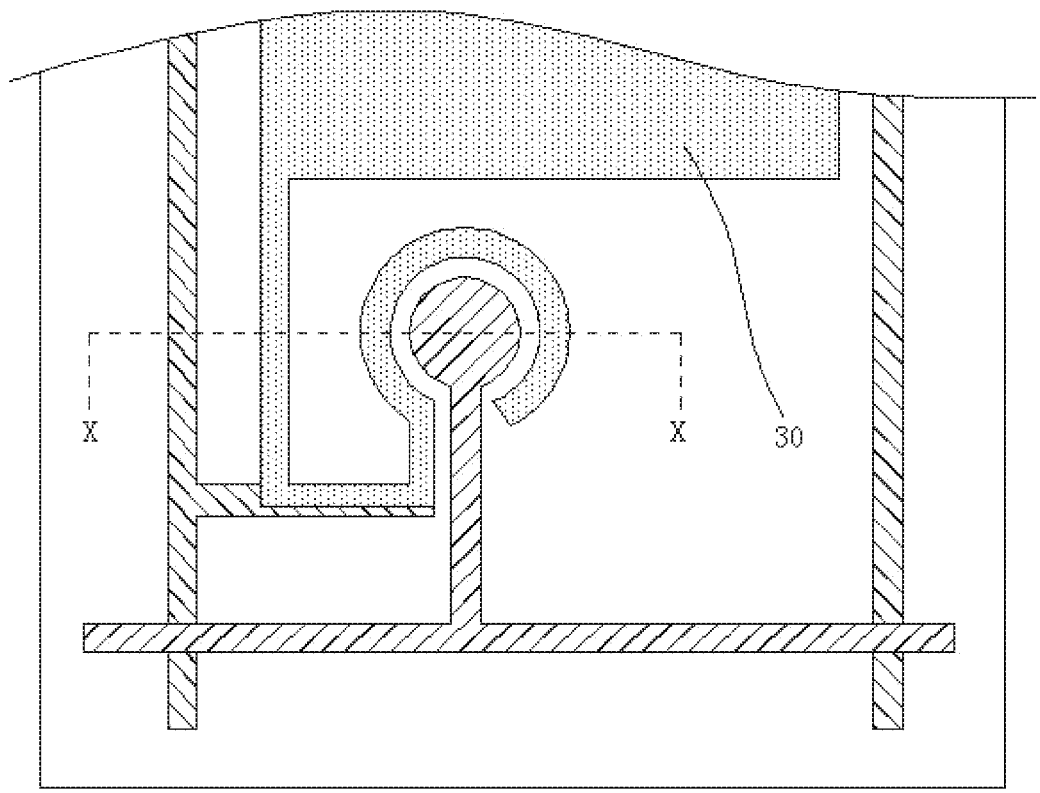

S30: as shown in FIGS. 4j and 4k, forming patterned pixel electrode 30 on the second insulation layer 26. The pixel electrode 30 is connected to the drain electrode 25 through the pixel via 261. FIG. 4k is a planar view to FIG. 4j. FIG. 4j is a sectional diagram showing the X-X section of FIG. 4k.

Specifically, this may be achieved by having a photoresist mask on the second insulation layer 26 exposing only the shape of the pixel electrode, or by reusing the photoresist mask of etching the pixel via 261 in the fourth mask process to deposit semiconductor material, lifting and photoresist mask, and forming the pixel electrode 30.

According to the TFT array substrate manufacturing method described above, the semiconductor active layer 23 is embedded in the first insulation layer 22. The semiconductor active layer 23 therefore surrounds the gate electrode 24 and forms a ring-shaped, vertically structured ditch region whose top side is covered and protected by the first insulation layer 22. Therefore, the adversary influence to the ditch region of the semiconductor active layer 23 by the subsequent processes (such as the patterning process for the drain electrode 25, the process for forming pixel electrode 30) after the semiconductor active layer 23 is formed can be effectively reduced, enhancing the electrical stability of the TFT.

Embodiment 2

As TFT array substrate is used over an extended period of time, the threshold voltage of the TFT would drift, resulting in inferior electrical properties from the TFT. Therefore, the present embodiment teaches another TFT array substrate based the previous Embodiment 1.

Figure 5:
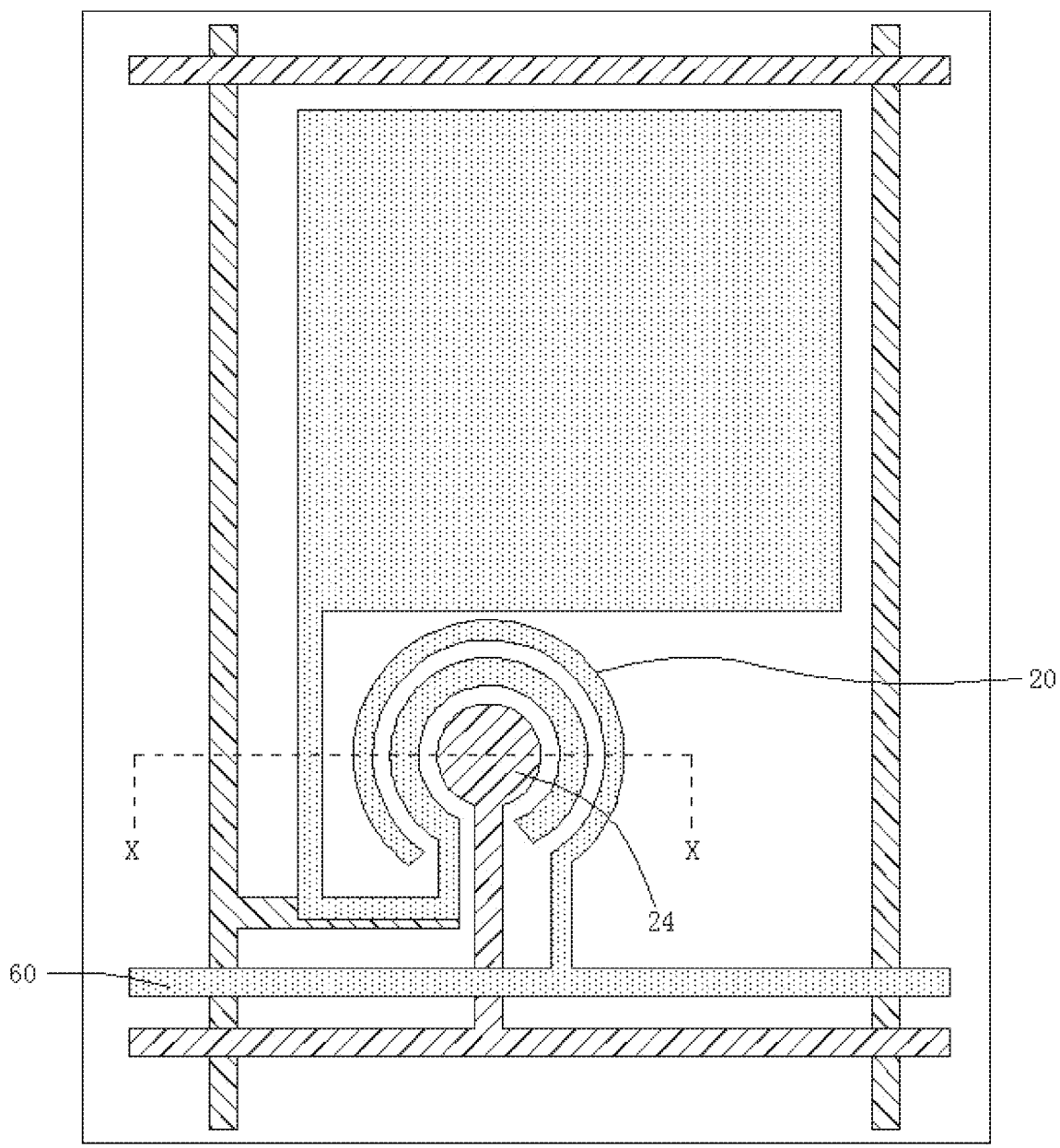
FIG. 5 is a planar diagram showing a TFT array substrate according to a second embodiment of the present invention
Figure 6:
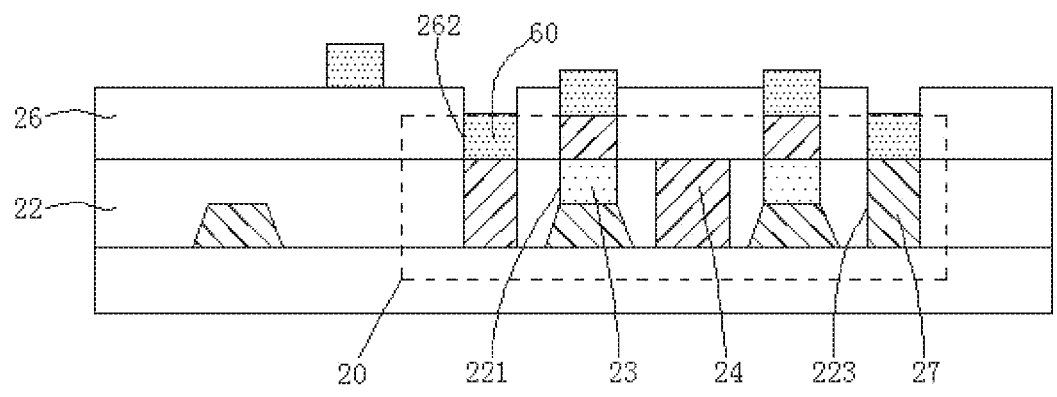
FIG. 6 is a sectional diagram showing an X-X section of the TFT array substrate of FIG. 5.

As shown in FIGS. 5 and 6, the TFT array substrate of the present embodiment differs from Embodiment 1 in that the TFT 20 further includes a secondary gate electrode 27 and the array substrate further includes a secondary gate line 60.

Specifically, as shown in FIGS. 5 and 6, on the basis of Embodiment 1, the first insulation layer 22 is further configured with a gate trough 223 surrounding the periphery of the ring trough 221. The secondary gate electrode 27 is formed in the gate trough 223 oppositely to the semiconductor active layer 23. A gate via 262 is further configured in the second insulation layer 26. The secondary gate line 60 is formed on the second insulation layer 26 and is connected to the secondary gate electrode 27 through the gate via 262.

Furthermore, in the present embodiment, the gate trough 223 has an identical shape as the ring trough 221, and surrounds the periphery of the ring trough 221. Therefore, the secondary gate electrode 27 is also co-axially disposed relative to the semiconductor active layer 23 and the gate electrode 24.

The other structure of the TFT array substrate of the present embodiment is identical to that of Embodiment 1, and the details are omitted here.

According to the present embodiment, the TFT 20 includes the gate electrode 24 and the secondary gate electrode 27, and has a dual-gate, ring-shaped, vertical structure. The gate electrode 24 inside the ring-shaped semiconductor active layer 23 is for the normal driving function including turning the TFT on and off. By adjusting the voltage applied to the secondary gate electrode 27 outside the ring-shaped semiconductor active layer 23, the threshold voltage drift after the TFT's extended operation may be compensated.

As shown in FIGS. 7a to 7f, a manufacturing method for the TFT array substrate of the present embodiment is based on the manufacturing method of Embodiment 1 with some of the steps being specifically modified as follows.

Figure 7A:
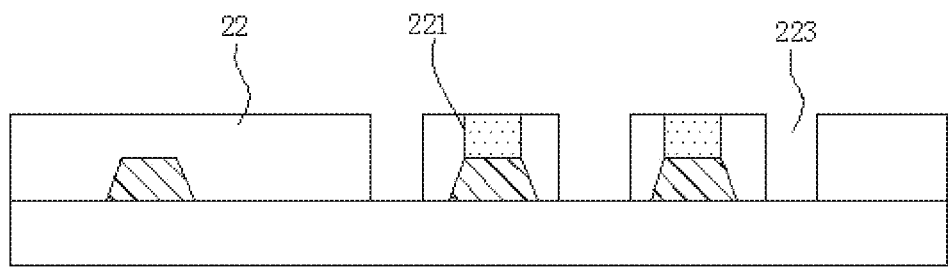
FIGS. 7a-7f show the TFT array substrate after the steps of a manufacturing method according to a second embodiment of the present invention.

In step S105, as shown in FIG. 7a, the gate trough 223 is formed on the first insulation layer 22 by etching. The gate trough 223 surrounds the periphery of the ring trough 221.

Figure 7B:
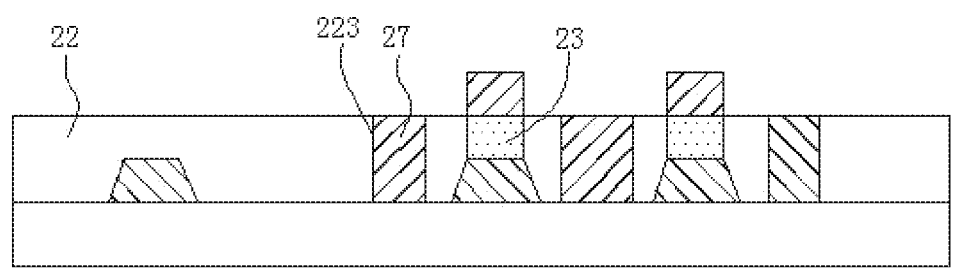
Figure 7C:
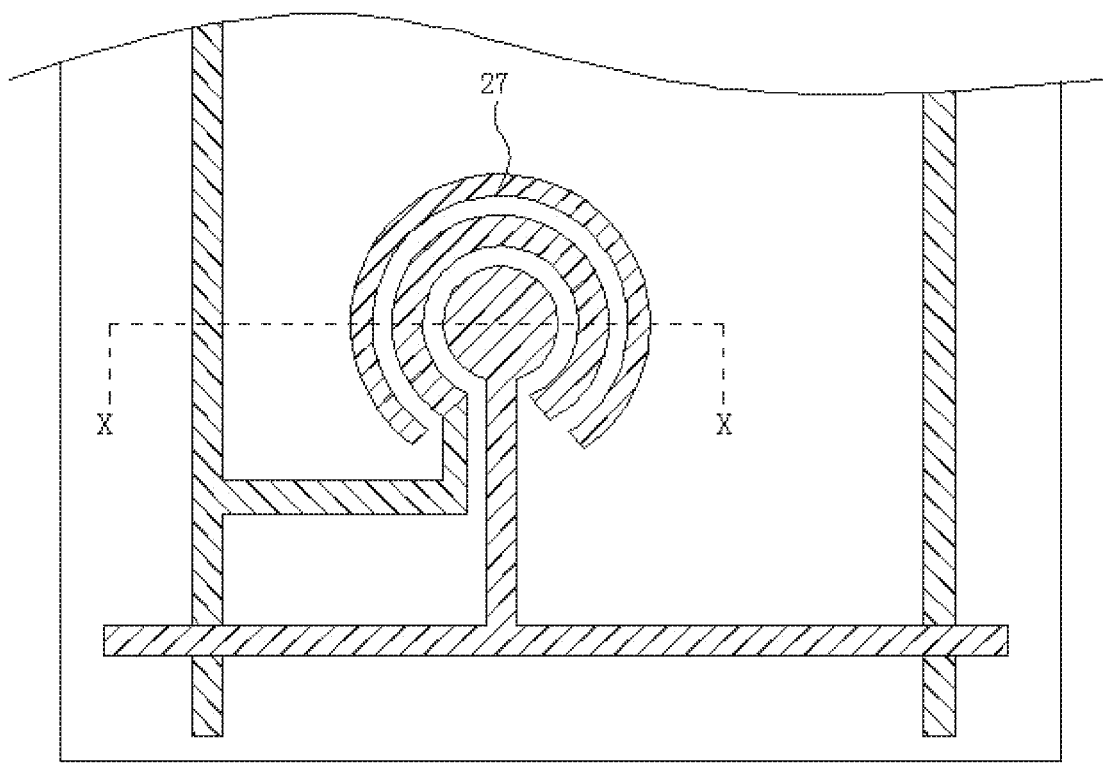

In step S106, as shown in FIGS. 7b and 7c, patterned secondary gate electrode 27 is formed on the first insulation layer 22. The secondary gate electrode 27 is formed in the gate trough 223 oppositely to the semiconductor active layer 23. FIG. 7c is a planar view to FIG. 7b. FIG. 7b is a sectional diagram showing the X-X section of FIG. 7c.

Figure 7D:
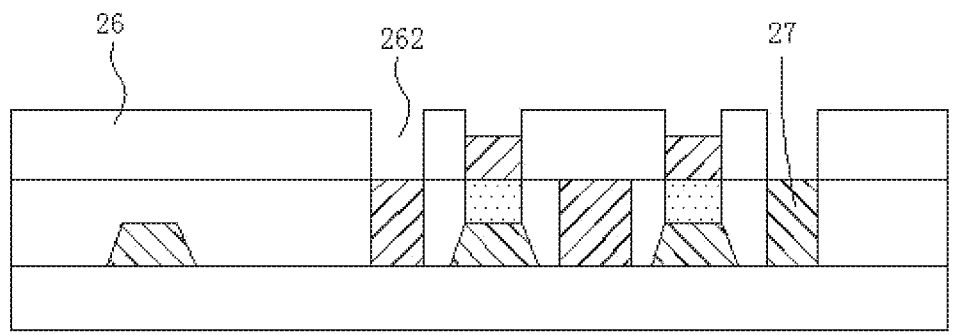

In step S20, as shown in FIG. 7d, the gate via 262 is formed by etching on the second insulation layer 26 to expose the secondary gate electrode 27.

Figure 7E:
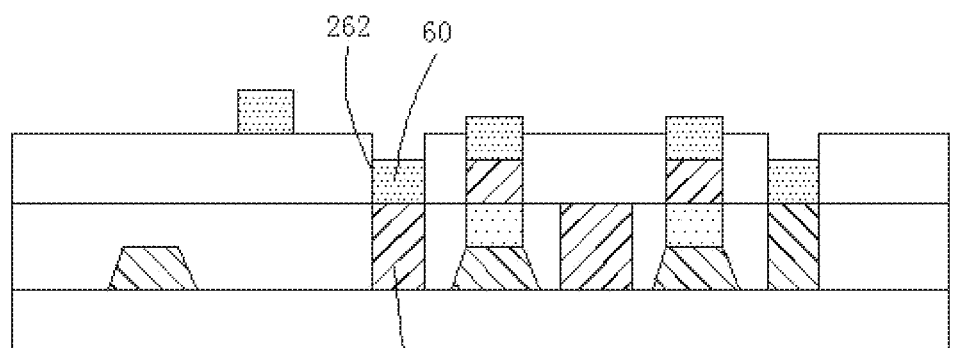
Figure 7F:
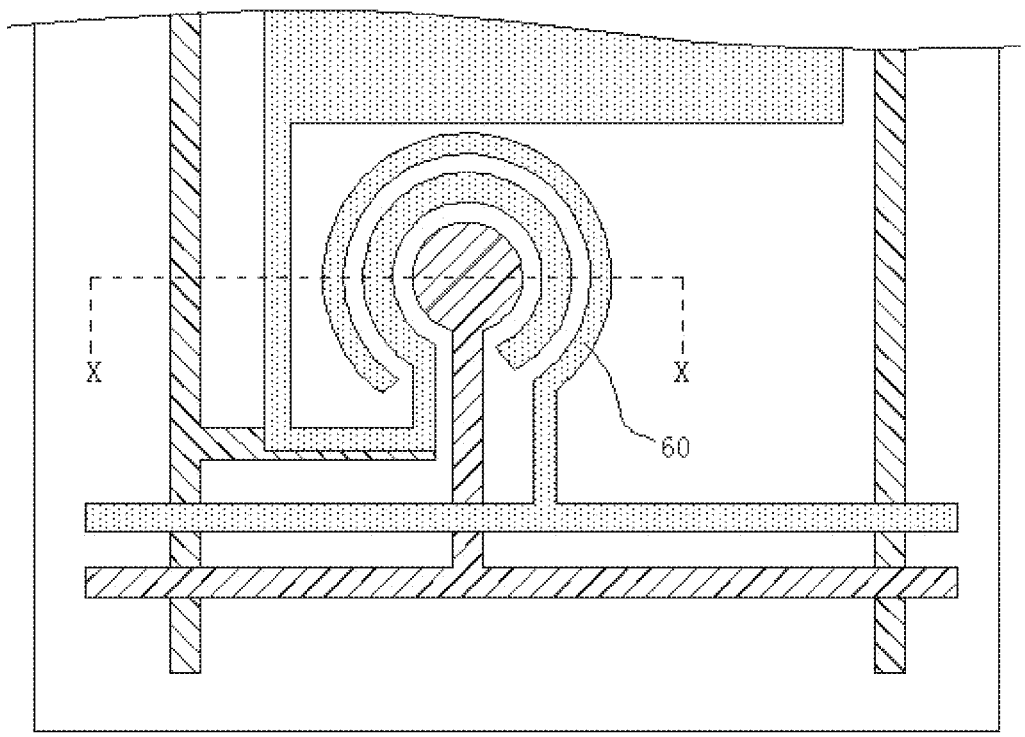

In step S30, as shown in FIGS. 7e and 7f, patterned secondary gate line 60 is formed on the second insulation layer 26. The secondary gate line 60 is connected to the secondary gate electrode 27 through the gate via 262. FIG. 7f is a planar view to FIG. 7e. FIG. 7e is a sectional diagram showing the X-X section of FIG. 7f.

The other steps of the TFT array substrate manufacturing method of the present embodiment are identical to those of Embodiment 1, and the details are omitted here.

The TFT array substrate and its manufacturing method of the present embodiment, on the basis of Embodiment 1, provide the secondary gate electrode to the TFT to resolve the threshold voltage drift problem when the TFT is operated for an extended period of time.

Embodiment 3

Some existing TFT array substrates have multi-domain pixel structure whose pixel unit is configured with primary pixel electrode and secondary pixel electrode. An issue for the multi-domain pixel structure is how to supply different pixel voltages to the primary and secondary pixel electrodes. Therefore, the present embodiment teaches yet another TFT array substrate based the previous Embodiment 1.

Figure 8:
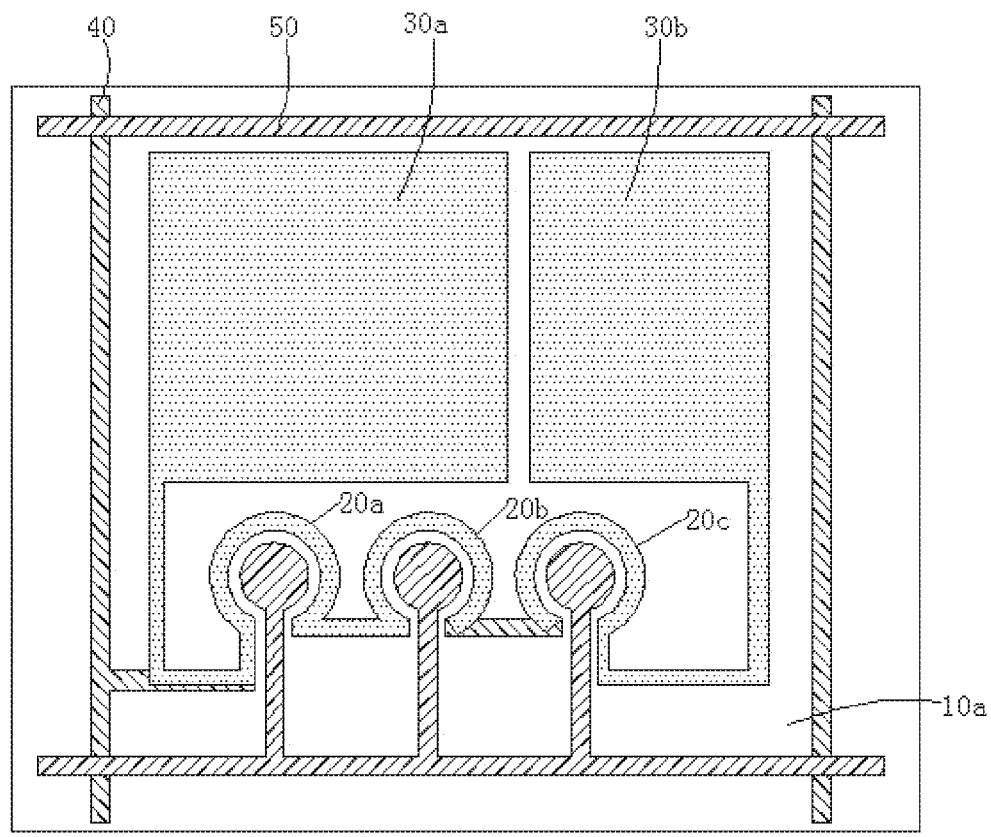
FIG. 8 is a planar diagram showing a TFT array substrate according to a third embodiment of the present invention

As shown in FIG. 8, the TFT array substrate includes a pixel unit 10a boxed out by the data lines 40 and gate lines 50. The pixel unit 10a includes three TFTs arranged at intervals, a primary pixel electrode 30a, and a secondary pixel electrode 30b. The three TFTs are a first TFT 20a, a second TFT 20b, and a third TFT 20c, all structured identically to the TFT 20 described in Embodiment 1. It should be noted that the first, second, and third TFTs 20a, 20b, and 20c may also have an identical structure to the TFT 20 described in Embodiment 2, or at least the first TFT 20a has the structure of the TFT 20 of Embodiment 2.

Figure 9:
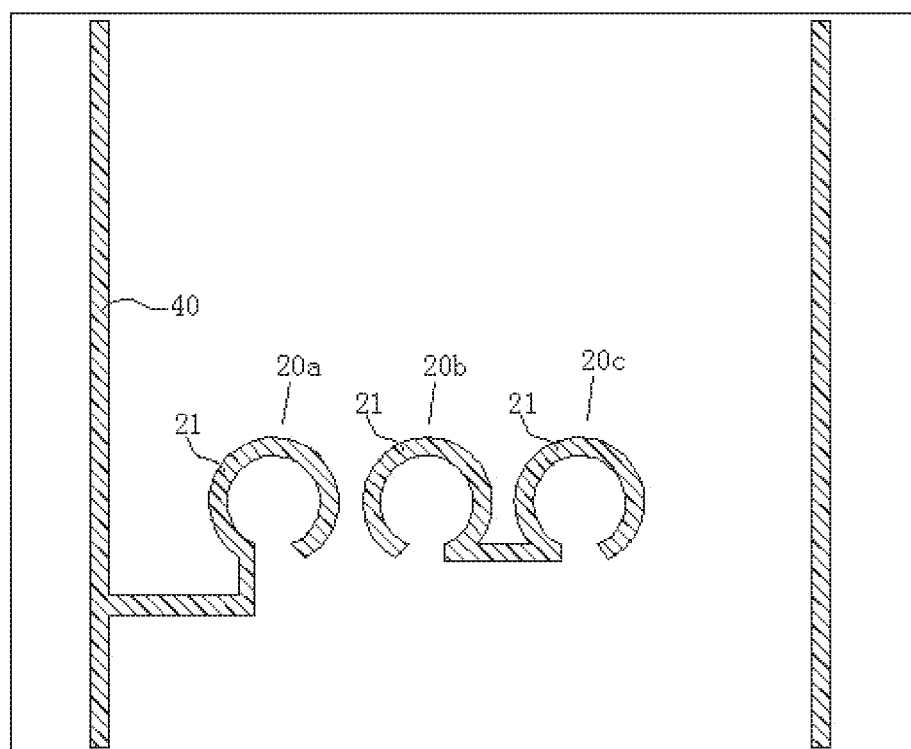
FIG. 9 is a structural schematic diagram showing a source electrode of the TFT array substrate of FIG. 8.

As shown in FIG. 9, the first TFT 20a has its source electrode 21 connected to the data line 40, and the second and third TFTs 20b and 20c have their source electrodes 21 connected to each other.

Figure 10:
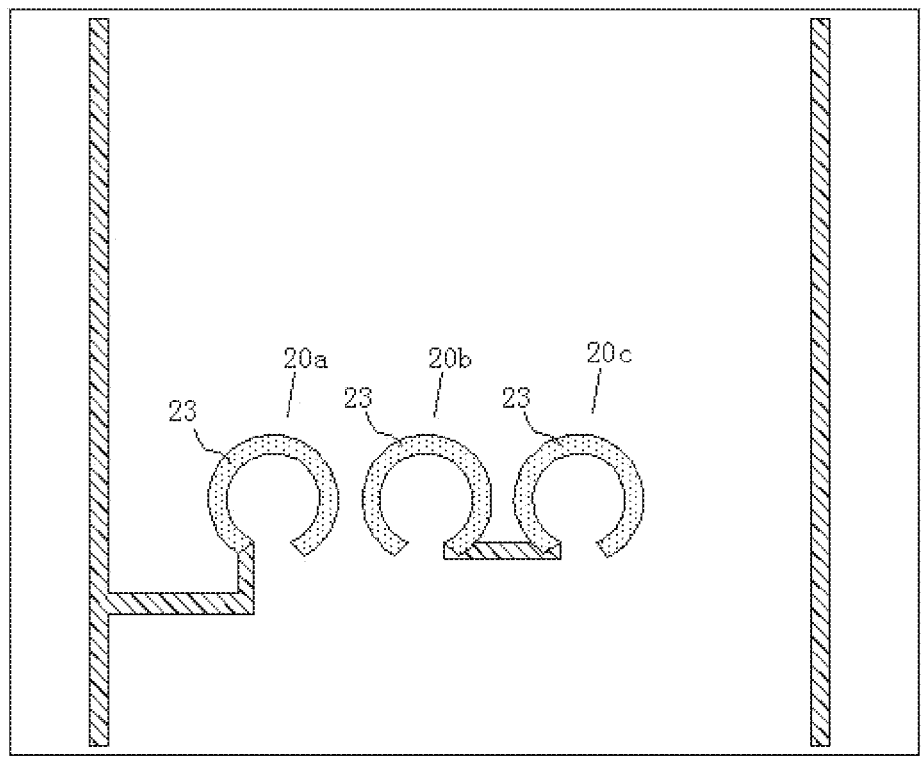
FIG. 10 is a structural schematic diagram showing a semiconductor active layer of the TFT array substrate of FIG. 8.

As shown in FIG. 10, the semiconductor active layers of the first, second, and third TFTs 20a, 20b, and 20c are respectively formed on their respective source electrodes 21.

Figure 11:
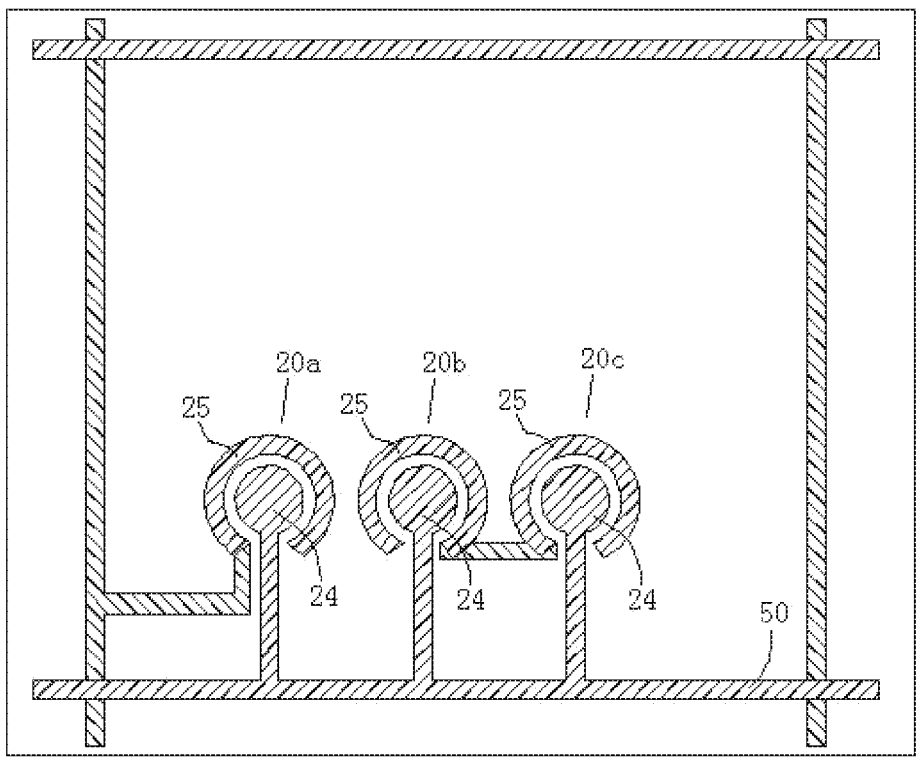
FIG. 11 is a structural schematic diagram showing a drain electrode of the TFT array substrate of FIG. 8.

As shown in FIG. 11, the drain electrodes 25 of the first, second, and third TFTs 20a, 20b, and 20c are respectively formed on their respective semiconductor active layers 23. The gate electrodes 24 of the first, second, and third TFTs 20a, 20b, and 20c are respectively connected to the gate line 50.

As shown in FIG. 8, the primary pixel electrode 30a is connected to the drain electrode 25 of the first TFT 20a. The secondary pixel electrode 30b is connected to the drain electrode 25 of the third TFT 20c. The drain electrodes 25 of the first and second TFTs 20a and 20b are connected together through a connection line 70.

For the TFT array substrate of the present embodiment described above, the first and second TFTs 20a and 20b have their drain electrodes 25 connected together. The second and third TFTs 20b and 20c have their source electrodes 21 connected together. Therefore, the first, second, and third TFTs 20a, 20b, and 20c are sequentially connected in series. The primary pixel electrode 30a is connected to the first TFT 20a, and the secondary pixel electrode 30b is connected to the third TFT 20c, thereby forming a multi-domain structure. Through series-connecting three TFTs with ring-shaped, vertically structured ditch regions, different pixel voltages are applied to the primary and secondary pixel electrodes 30a and 30b, improving the wide viewing angle and color shift problems.

As shown in FIGS. 8 to 11, a manufacturing method for the TFT array substrate of the present embodiment is based on the manufacturing method of Embodiment 1 with some of the steps being specifically modified as follows.

In step S10, identically structured first, second, and third TFTs 20a, 20b, and 20c are formed at intervals on the substrate 10 following steps S101 to S106. As shown in FIG. 9, the first TFT 20a has its source electrode 21 connected to the data line 40, and the second and third TFTs 20b and 20c have their source electrodes 21 connected to each other.

In step S20, a first pixel via, a second pixel via, and a third pixel via are formed by etching on the second insulation layer 26 corresponding to where the drain electrodes 25 of the first, second, and third TFTs 20a, 20b, and 20c are located.

In step S30, patterned primary pixel electrode 30a, secondary pixel electrode 30b, and 20c through the third pixel 70 are formed on the second insulation layer 26. The primary pixel electrode 30a is connected to the drain electrode 25 of the first TFT via, the secondary pixel electrode 30b is connected to the drain electrode 25 of the third TFT 20a through the first pixel via, and the connection line 70 connects the drain electrodes 25 of the first and second TFTs 20a and 20b together through the first and second pixel vias.

For the TFT array substrate and its manufacturing method of the present embodiment, different pixel voltages are applied to the primary and secondary pixel electrodes through series-connecting three TFTs with ring-shaped, vertically structured ditch regions, thereby improving the wide viewing angle and color shift problems.

It should be noted that, in the present specification, terms such as "first," "second," etc. are for reference purpose only so as to distinguish one entity or operation from another entity or operation. They do not specify or imply that there is some preference or order among these entities or operations. Additionally, "include," "comprise," or other similar terms do not exclude any element not explicitly specified. In other words, an object "includes" not only those elements explicitly listed, but also those elements not explicitly specified and those elements inherent in the object. Without further limitation, phrases like "an object includes one . . . " do not exclude that there may be other identical element.

Above are embodiments of the present invention, which does not limit the scope of the present invention. Any equivalent amendments within the spirit and principles of the embodiment described above should be covered by the protected scope of the invention.

What is claimed is:

1. A thin film transistor (TFT) array substrate manufacturing method, comprising
    S10: providing a substrate and forming a TFT on the substrate, comprising
        S101: forming patterned data line and source electrode on the substrate, where the data line and the source electrode are connected to each other, and the source electrode has a ring shaped structure,
        S102: forming a first insulation layer on the substrate to cover the data line and the source electrode,
        S103: forming a ring trough on the first insulation layer by etching, where the source electrode is exposed from the ring trough,
        S104: forming in the ring trough a semiconductor active layer that connects the source electrode,
        S105: forming a channel on the first insulation layer by etching in an area surrounded by the ring trough, and
        S106: forming patterned gate line, gate electrode, and drain electrode on the first insulation layer, where the gate electrode is formed in the channel opposite to the semiconductor active layer and is connected to the gate line, and the drain electrode is connected to the semiconductor active layer;
    S20: forming a second insulation layer on the TFT, and forming a pixel via on the second insulation layer to expose the drain electrode; and
    S30: forming patterned pixel electrode on the second insulation layer, where the pixel electrode is connected to the drain electrode through the pixel via.

2. The TFT array substrate manufacturing method according to claim 1, wherein
    in step S105, the gate trough is formed on the first insulation layer by etching, and the gate trough surrounds a periphery of the ring trough;
    in step S106, patterned secondary gate electrode is formed on the first insulation layer, and the secondary gate electrode is formed in the gate trough oppositely to the semiconductor active layer;
    in step S20, a gate via is formed by etching on the second insulation layer to expose the secondary gate electrode; and
    in step S30, patterned secondary gate line is formed on the second insulation layer, and the secondary gate line is connected to the secondary gate electrode through the gate via.

3. The TFT array substrate manufacturing method according to claim 1, wherein
    in step S10, identically structured first, second, and third TFTs are formed at intervals on the substrate following steps S101 to S106, the first TFT has its source electrode connected to the data line, and the second and third TFTs have their source electrodes connected to each other;
    in step S20, a first pixel via, a second pixel via, and a third pixel via are formed by etching on the second insulation layer corresponding to where the drain electrodes of the first, second, and third TFTs are located; and
    in step S30, patterned primary pixel electrode, secondary pixel electrode, and 20c through the third pixel are formed on the second insulation layer, the primary pixel electrode is connected to the drain electrode of the first TFT through the first pixel via, the secondary pixel electrode is connected to the drain electrode of the third TFT through the third pixel via, and the connection line connects the drain electrodes of the first and second TFTs together through the first and second pixel vias.

4. A TFT array substrate, comprising a pixel unit boxed out by data lines and gate lines, wherein the pixel unit comprises a TFT and a pixel electrode configured in the pixel unit; the TFT comprises:

a source electrode formed on the substrate where the source electrode has a ring shape, is at a same layer as a corresponding data line, and is connected to the data line, a first insulation layer formed on the substrate that covers the source electrode and the data line where a ring trough and a channel are configured in the first insulation layer, the ring trough is above and exposes the source electrode, and the channel is located in an area surrounded by the ring trough, a semiconductor active layer formed in the ring trough connected to the source electrode, a gate electrode formed in the channel opposite to the semiconductor active layer, a drain electrode formed on the first insulation layer connected to the semiconductor active layer where a corresponding gate line is formed on the first insulation layer connected to the gate electrode, and a second insulation layer covering the TFT where a pixel via is configured in the second insulation layer, and the pixel electrode is formed on the second insulation layer connected to the drain electrode through the pixel via.

5. The TFT array substrate according to claim 4, wherein the source electrode has a ring structure with a gap; the semiconductor active layer and the drain electrode has a same shape as the source electrode; and the source electrode, the semiconductor active layer, and the drain electrode are sequentially stacked and connected.

6. The TFT array substrate according to claim 5, wherein the channel has a cylindrical shape; the gate electrode has a cylindrical shape; the semiconductor active layer and the gate electrode are disposed co-axially.

7. The TFT array substrate according to claim 4, wherein the pixel unit comprises identically structured first, second, and third TFTs at intervals, and a primary pixel electrode and a secondary pixel electrode;

the first TFT has its source electrode connected to the data line, and the second and third TFTs have their source electrodes connected to each other; the gate electrodes of the first, second, and third TFTs are respectively connected to the gate line;

the primary pixel electrode is connected to the drain electrode of the first TFT; the secondary pixel electrode is connected to the drain electrode of the third TFT; and the drain electrodes of the first and second TFTs are connected together.

8. The TFT array substrate according to claim 7, wherein the source electrode has a ring structure with a gap; the semiconductor active layer and the drain electrode has a same shape as the source electrode; and the source electrode, the semiconductor active layer, and the drain electrode are sequentially stacked and connected.

9. The TFT array substrate according to claim 8, wherein the channel has a cylindrical shape; the gate electrode has a cylindrical shape; the semiconductor active layer and the gate electrode are disposed co-axially.

10. The TFT array substrate according to claim 4, wherein the TFT 20 further comprises a secondary gate electrode; the array substrate further comprises a secondary gate line;

the first insulation layer is further configured with a gate trough surrounding a periphery of the ring trough; the secondary gate electrode is formed in the gate trough oppositely to the semiconductor active layer;

a gate via is further configured in the second insulation layer; and the secondary gate line is formed on the second insulation layer and is connected to the secondary gate electrode through the gate via.

11. The TFT array substrate according to claim 10, wherein the gate trough has an identical shape as the ring trough, and surrounds a periphery of the ring trough.

12. The TFT array substrate according to claim 10, wherein the source electrode has a ring structure with a gap; the semiconductor active layer and the drain electrode has a same shape as the source electrode; and the source electrode, the semiconductor active layer, and the drain electrode are sequentially stacked and connected.

13. The TFT array substrate according to claim 10, wherein the channel has a cylindrical shape; the gate electrode has a cylindrical shape; the semiconductor active layer and the gate electrode are disposed co-axially.

14. The TFT array substrate according to claim 13, wherein the gate trough has an identical shape as the ring trough, and surrounds a periphery of the ring trough; and the secondary gate electrode, the semiconductor active layer, and the gate electrode are disposed co-axially.

15. The TFT array substrate according to claim 10, wherein the pixel unit comprises identically structured first, second, and third TFTs at intervals, and a primary pixel electrode and a secondary pixel electrode;

the first TFT has its source electrode connected to the data line, and the second and third TFTs have their source electrodes connected to each other; the gate electrodes of the first, second, and third TFTs are respectively connected to the gate line; the secondary gate electrodes of the first, second, and third TFTs are respectively connected to the secondary gate line;

the primary pixel electrode is connected to the drain electrode of the first TFT; the secondary pixel electrode is connected to the drain electrode of the third TFT; and the drain electrodes of the first and second TFTs are connected together.

16. The TFT array substrate according to claim 15, wherein the gate trough has an identical shape as the ring trough, and surrounds a periphery of the ring trough.

17. The TFT array substrate according to claim 15, wherein the source electrode has a ring structure with a gap; the semiconductor active layer and the drain electrode has a same shape as the source electrode; and the source electrode, the semiconductor active layer, and the drain electrode are sequentially stacked and connected.

18. The TFT array substrate according to claim 15, wherein the channel has a cylindrical shape; the gate electrode has a cylindrical shape; the semiconductor active layer and the gate electrode are disposed co-axially.

19. The TFT array substrate according to claim 18, wherein the gate trough has an identical shape as the ring trough, and surrounds a periphery of the ring trough; and the secondary gate electrode, the semiconductor active layer, and the gate electrode are disposed co-axially.

* * * * *